United States Patent [19]

Itoh

[11] Patent Number: 4,523,153

[45] Date of Patent: Jun. 11, 1985

[54] VARIABLE GAIN AMPLIFIER

[75] Inventor: Yasuhiro Itoh, Tokyo, Japan

[73] Assignee: Iwatsu Electric Co., Ltd., Tokyo, Japan

[21] Appl. No.: 599,943

[22] Filed: Apr. 13, 1984

[30] Foreign Application Priority Data

Apr. 27, 1983 [JP] Japan .................................. 58-74824
Jan. 31, 1984 [JP] Japan .................................. 59-15754

[51] Int. Cl.$^3$ ......................... H03G 3/18; H03F 3/45
[52] U.S. Cl. .................................... 330/254; 330/279
[58] Field of Search ............... 330/129, 130, 131, 254, 330/279

[56] References Cited

U.S. PATENT DOCUMENTS 3,689,752 9/1972 Gilbert ............................... 235/194

OTHER PUBLICATIONS

Hewlett-Packard Journal, Sep., 1982; pp. 10-12.

Primary Examiner—James B. Mullins
Assistant Examiner—Steven J. Mottola
Attorney, Agent, or Firm—Woodcock Washburn Kurtz Mackiewicz & Norris

[57] ABSTRACT

An amplifier system having a first pair of transistors connected between a pair of differential input terminals and a pair of differential output terminals, and a second pair of transistors having emitters connected to the respective input terminals and having collectors connected to a bias source. For a linear change in current gain a collector current sensing circuit is provided which puts out a voltage representative of the sum of the collector currents of either the first or second pair of transistors. This voltage is delivered to an input of a differential feedback amplifier, to another input of which is applied a variable gain control voltage. The differential amplifier delivers its output voltage, proportional to the difference between the two input voltages, to the bases of either the first or second pair of transistors. With the two input voltages of the differential amplifier thus made equal to each other, the current gain of the amplifier can be changed linearly with the gain control voltage.

19 Claims, 16 Drawing Figures

VARIABLE GAIN AMPLIFIER

BACKGROUND OF THE INVENTION

My invention relates to amplifiers in general and, in particular, to a variable gain amplifier with provisions for a linear change in current gain. The variable gain amplifier of my invention is of the class finding use in, for example, the deflection systems of cathode ray oscilloscopes.

Figure 1:
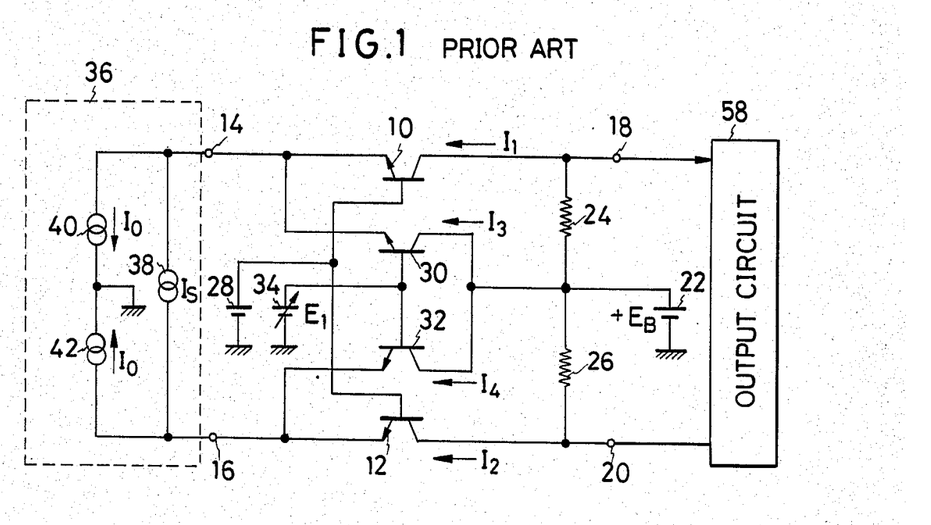
FIG. 1 is a schematic electrical diagram of an example of prior art variable gain amplifier pertinent of my invention.

A variable gain amplifier circuit is known which comprises a pair of transistors connected between a pair of input terminals and a pair of output terminals. Two methods have commonly been employed to vary the current gain between the input and output terminals. One of the methods calls for the use of a second pair of transistors connected between the emitters of the first recited pair of transistors and ground to provide current bypasses (FIG. 1). The biases applied to the bases of the second pair of transistors are varied to control the current magnitudes bypassed and so to control the current gain.

Figure 2:
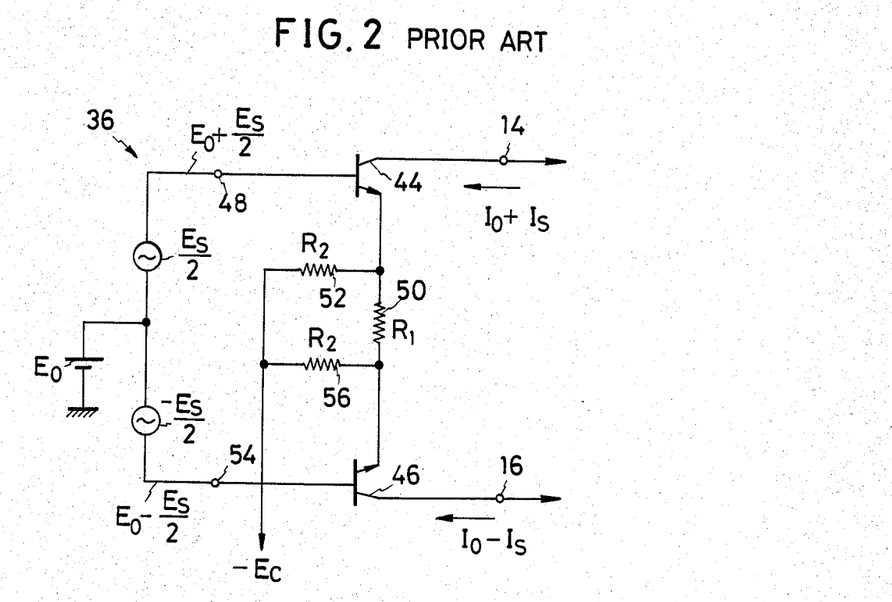
FIG. 2 is a schematic electrical diagram showing the input circuit of the FIG. 1 amplifier in more detail.

The other known method dictates the connection of a second pair of transistors between the input and output terminals in phase opposition one to each of the first pair of transistors (FIG. 2). Thus, by varying the base biases of the second pair of transistors, their collector currents act to cancel the collector currents of the first pair of transistors in a controlled manner.

Both of these known methods have some problems adversely affecting the desired linearity of current gain. The collector current of the transistor is an exponential function of the base to emitter voltage $V_{BE}$, so that a nonlinear change in current gain has taken place in response to a change in the $V_{BE}$ of the second pair of transistors. The gain of the noted prior art amplifiers has also been greatly temperature dependent and further has been affected by fluctuations in the $V_{BE}$-$I_C$ characteristic of the two pairs of transistors in use. I will later discuss these problems in more detail with reference to the drawings attached hereto.

Gilbert U.S. Pat. No. 3,689,752 suggests a solution to some of the above problems. Gilbert's solution is the provision of a bias circuit comprising an additional pair of transistors for the first and second pairs of transistors. The bias circuit with its additional pair of transistors makes possible the provision of a linear current gain amplifier, with the linearity being practically independent of temperature, provided that the total of six transistors in use are all of the same $V_{BE}$-$I_C$ characteristic. The fabrication of an integrated circuit comprising six transistors of the same characteristic in question is highly difficult, however, and adds considerably to the cost of the amplifier.

SUMMARY OF THE INVENTION

My invention provides a thoroughly practicable solution to the foregoing problems and makes possible, in an amplifier of the class under consideration, a linear change in current gain in the face of possible fluctuations in the $V_{BE}$-$I_C$ characteristic of the two pairs of transistors in use.

Stated broadly, my invention provides a variable gain amplifier comprising a first pair of transistors connected between a pair of input terminals for receiving differential inputs and a pair of output terminals for producing differential outputs in response to the differential inputs. The first pair of transistors have their emitters connected to the respective input terminals, their collectors connected to the respective output terminals, and their bases interconnected. A second pair of transistors are provided which have their emitters connected to the respective input terminals, and their collectors interconnected and adapted to be biased by collector bias means. The amplifier further comprises collector current sensing means for providing a voltage representative of the sum of the collector currents of either of the first and second pairs of transistors, and a variable voltage source for providing a variable gain control voltage for controllably varying the current gain of the amplifier. The output voltage from the collector current sensing means and the gain control voltage from the variable voltage source are both input to a differential amplifier. A voltage proportional to the difference between the two input voltages is applied by the differential amplifier to the bases of either of the first and second pairs of transistors. The other of the first and second pairs of transistors have their bases connected to base bias means.

Thus the variable gain amplifier according to my invention has provisions for feedback control such that the voltage representative of the sum of the collector currents of either the first or second pair of transistors may be made equal to the variable gain control voltage. A linear relation can thus be established between the gain control voltage and the amplifier gain. The linearity is independent of temperature and possible variations in the $V_{BE}$-$I_C$ characteristic between each of the first pair of transistors and the associated one of the second pair of transistors.

The above and other features and advantages of my invention and the manner of realizing them will become more apparent, and the invention itself will best be understood, from study of the following description and appended claims, with reference had to the attached drawings showing some preferable embodiments of my invention.

DETAILED DESCRIPTION

I will explain the above listed problems of the prior art in some more detail with reference to FIGS. 1 through 5 of the drawings, the better to make clear the features and advantages of my invention. FIG. 1 shows the known example of variable gain amplifier in which a pair of transistors 10 and 12 are connected between a pair of differential input terminals 14 and 16 and a pair of differential output terminals 18 and 20. The first transistor 10 has its emitter connected to the first input terminal 14, and its collector to the first output terminal 18. The collector of the first transistor 10 is further connected to a power supply 22 of $+E_B$ via a resistor 24. The second transistor 12 has its emitter connected to the second input terminal 16, and its collector to the second output terminal 20. The collector of the second transistor is further connected to the power supply 22 via another resistor 26. The bases of the transistors 10 and 12 are both connected to a common fixed bias source 28.

The known FIG. 1 amplifier comprises another pair of transistors, referred to as the third 30 and fourth 32 transistors for convenience. The third transistor 30 has its emitter connected to the first input terminal 14, and its collector to the power supply 22. The fourth transistor 32 has its emitter connected to the second input terminal 20, and its collector connected to the power supply 22 in common with the collector of the third transistor 30. The bases of the transistors 30 and 32 are connected to a common variable voltage source 34 which is to be activated for controllably varying the gain of the amplifier.

Shown enclosed in the dashed outline and generally designated 36 is an input circuit including a signal current source 38 connected between the pair of input terminals 14 and 16 for the production of a signal current Is. The input circuit 36 further includes first 40 and second 42 bias current sources for the production of bias current Io. The first bias current source 40 is connected between first input terminal 14 and ground, and the second bias current source 42 between second input terminal 16 and ground. The bias current Io is of greater magnitude than the signal current Is.

I have drawn the input circuit 36 highly diagrammatically in FIG. 1. FIG. 2, then, is a more detailed representation of an example of configuration which the input circuit 36 may take in practice. The exemplified input circuit configuration includes a pair of transistors 44 and 46 constituting a differential amplifier. The transistor 44 has its base connected to a terminal 48 to which there is applied the sum of a direct current (DC) base bias voltage Eo and a signal voltage Es/2. The collector of the transistor 44 is connected to the first input terminal 14. The emitter of the transistor 44 is connected, on one hand, to the emitter of the other transistor 46 via a resistor 50 and, on the other band, to a DC power supply ($-Ec$) via a resistor 52. The transistor 46 has its base connected to a terminal 54 to which there is applied the resultant of the DC base bias voltage Eo and a signal voltage $-Es/2$. The collector of the transistor 46 is connected to the second input terminal 16. The emitter of the transistor 46 is connected, on one hand, to the emitter of the transistor 44 via the resistor 50 and, on the other hand, to the DC power supply $-Ec$ via a resistor 56.

Let it be assumed that the resistor 50 offers resistance R1, and the resistors 52 and 56 offer the same resistance R2. Then the signal current Is and bias current Io can be given by the equations $$Is = Es/R1$$

and $$Io = (Eo + Ec)/R2.$$

It will be observed from FIGS. 1 and 2 that the pair of transistors 10 and 12 have their emitters connected respectively to the collectors of the pair of transistors 44 and 46 of the input circuit 36. There are thus formed a pair of cascode amplifiers.

As will be seen also from FIG. 1, the pair of output terminals 18 and 20 of the known variable gain amplifier is connected to an output circuit indicated in block form and designated 58. In practice this output circuit 58 may take the form of a differential amplifier shown in detail in FIG. 3. The differential amplifier exemplified as the output circuit 58 includes a pair of transistors 60 and 62 having their bases connected to the pair of variable gain amplifier output terminals 18 and 20 respectively. The emitters of the transistors 60 and 62 are interconnected via a resistor 64. The emitter of the transistor 60 is further connected to the DC power supply $-Ec$ via a resistor 66, and the emitter of the other transistor 62 to the DC power supply $-Ec$ via a resistor 68.

Figure 3:
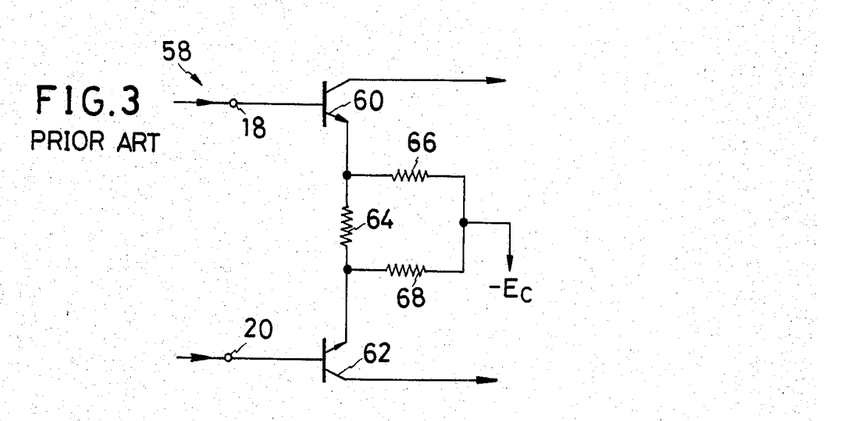
FIG. 3 is a similar diagram showing the output circuit of the FIG. 1 embodiment in more detail.

In the known variable gain amplifier configured as in FIGS. 1 through 3, let I1, I2, I3 and I4 be the collector currents of the transistors 10, 12, 30 and 32 respectively. Then the current gain of the amplifier (I1-I2)Is, is variable by controlling the ratios of I1 to I3 and of I2 or I4, that is, by controlling the pair of transistors 30 and 32 to vary the currents flowing through the bypasses leading from these transistors to the ground through the power supply 22. The collector currents I3 and I4 of the pair of transistors 30 and 32 in question are variable at will be controlling the voltage E1 of the variable voltage source 34. It thus becomes possible to controllably vary the current gain between the input terminal 14 and output terminal 18 and between the input terminal 16 and output terminal 20, in the range from zero to one.

The collector current Ic of the transistor can be expressed as $$Ic \approx K1 \exp(K2 \cdot V_{BE}/T) \qquad (1)$$

where $V_{BE}$ is the base to emitter voltage, T is the temperature, and K1 and K2 are constants. The collector current is thus an exponential function of the base to emitter voltage, changing nonlinearly therewith. The base to emitter voltages of the transistors 30 and 32 are changed by manual activation of the variable voltage source 34 for gain control. However, since the collector current changes nonlinearly with the base to emitter voltage as aforesaid, changes in the output voltage of the source 34 have tended to result in irregular changes in the amplifier gain. The amplifier gain is also subject to change with temperatures since the collector current is an exponential function of temperature.

The prior art amplifier of FIGS. 1 through 3 has another problem affecting its current gain. The problem arises from possible fluctuations in the $V_{BE}$-$I_C$ characteristic of the transistors 10, 12, 30 and 32. Should these transistors be dissimilar in that characteristic, no definite relationship would exist between the gain control voltage developed by the variable voltage source 34 and the consequent gain of the amplifier. Fine adjustment of the transistor characteristics has thus been necessary to establish the definite relationship for each amplifier produced. For example, if the first pair of transistors 10 and 12 are unlike in the $V_{BE}$-$I_C$ characteristic, and if the second pair of transistors 30 and 32 are unlike in the $V_{BE}$-$I_C$ characteristic, a difference will occur between the ratio of the collector current of the first transistor 10 to that of the third transistor 30 and the ratio of the collector current of the second transistor 12 to that of the fourth transistor 32. The difference will manifest itself as a difference between the current gain from first input terminal 14 to first output terminal 18 and the current gain from second input terminal 16 to second output terminal 20. In some instances the first pair of transistors 10 and 12 may have the same characteristic, and the second pair of transistors 30 and 32 may also have the same characteristic. Even in such cases, however, the gain may not change properly with changes in the gain control voltage if the first 10 and third 30 transistors, and the second 12 and fourth 32 transistors, have dissimilar characteristics.

Figure 4:
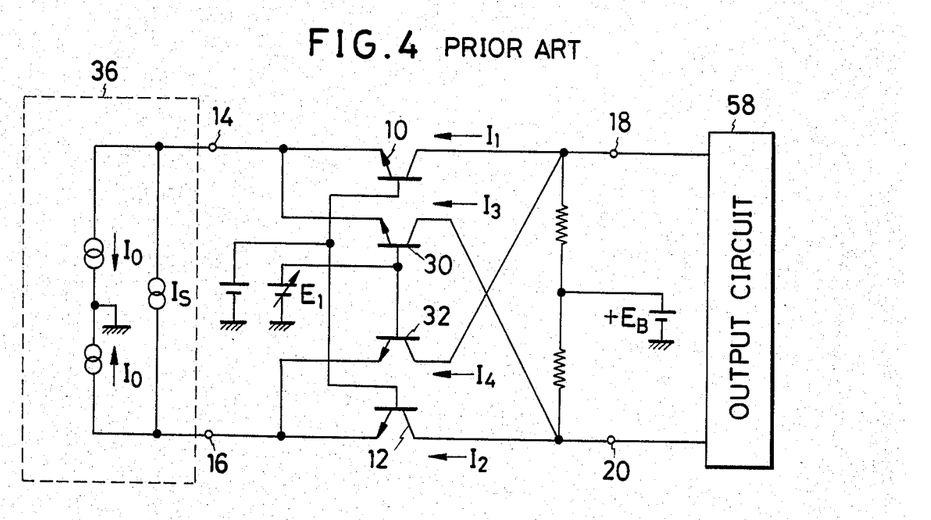
FIG. 4 is a schematic electrical diagram of another example of prior art variable gain amplifier pertinent to my invention.

FIG. 4 shows another prior art variable gain amplifier, which is a modification of the FIG. 1 amplifier, modified to make the current gain variable in the range from −1 to +1. In this second known amplifier the second pair of transistors 30 and 32 do not have their collectors interconnected as in the FIG. 1 circuit; instead, the collector of the transistor 30 is connected to the second output terminal 20, and the collector of the transistor 32 to the first output terminal 18. The other details of configuration of the FIG. 4, circuit, including its input circuit 36 and output circuit 58, are exactly as set forth above with reference to FIGS. 1 through 3.

It will therefore be understood that in the known FIG. 4 amplifier, the currents flowing through the first pair of transistors 10 and 12 are cancelled by the currents flowing through the second pair of transistors 30 and 32, which are opposite in phase. The current gain between input terminals 14 and 16 and output terminals 18 and 20 is variable by controlling the biases applied to the second pair of transistors 30 and 32. This known amplifier has the same problems as pointed out in connection with the FIG. 1 device.

I am aware of one known method for remedying the above problems of the prior art. This method calls for the use of a bias circuit 70, FIG. 5, for the two pairs of transistors 10, 12, 30 and 32. The bias circuit 70 has a pair of transistors 72 and 74 having the same $V_{BE}$-$I_C$ characteristic as the two pairs of transistors of the variable gain amplifier configured as in FIG. 1 or 4. The bases of the transistors 72 and 74 are connected to the common fixed bias source 28 whereas their collectors are connected to a common power supply designated +B. The emitter of the transistor 72 is connected to the bases of the first pair of transistors 10 and 12, and the emitter of the other transistor 74 to the bases of the second pair of transistors 30 and 32. Further a variable current source 76 is connected between the ground and the emitter of the transistor 72. Another variable current source 78 subservient to the current source 76 is connected between the ground and the emitter of the transistor 74.

Figure 5:
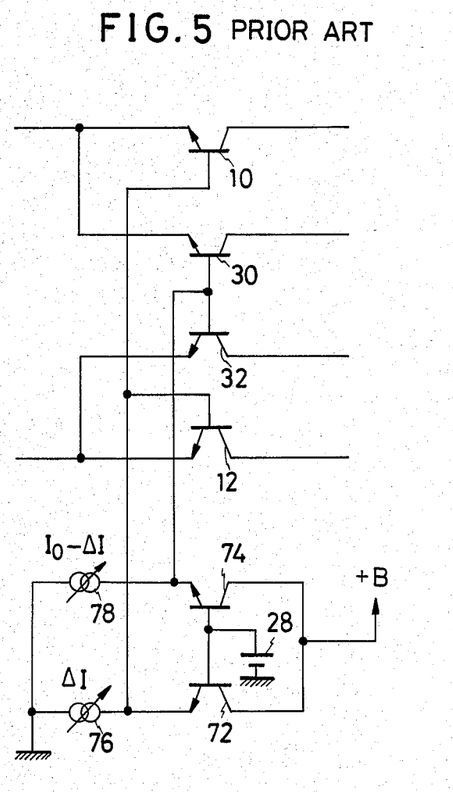
FIG. 5 is a partial schematic electrical diagram of still another example of prior art variable gain amplifier, the diagram showing in particular a bias circuit for the two pairs of transistors in the FIG. 1 or 4 embodiment.

Thus, if the six transistors 10, 12, 30, 32, 72 and 74 have all the same $V_{BE}$-$I_C$ characteristic, current (Io−ΔI) will flow through the first pair of transistors 10 and 12, and current I through the second pair of transistors 30 and 32, where ΔI denotes the degree of activation effected for gain control. This means that a linear relation is established between the degree of activation and the consequent change in gain. The additional pair of transistors 72 and 74 further function to compensate for the temperature dependence of the base to emitter voltage of the transistors 10, 12, 30 and 32.

This conventional solution has some drawbacks, however. One is the difficulties involved in the provision of the transistors 10, 12, 30, 32, 72 and 74 of the same $V_{BE}$-$I_C$ characteristic. The fabrication of integrated circuits having six transistors of the same characteristic becomes even more difficult if they are intended for operation in the ultrahigh frequency range, because then their bases must be of minimal thickness. Another disadvantages is an increase in the power requirement of the amplifier arising from the constant flow of the current Io through the bias circuit.

PREFERRED EMBODIMENTS

Figure 6:
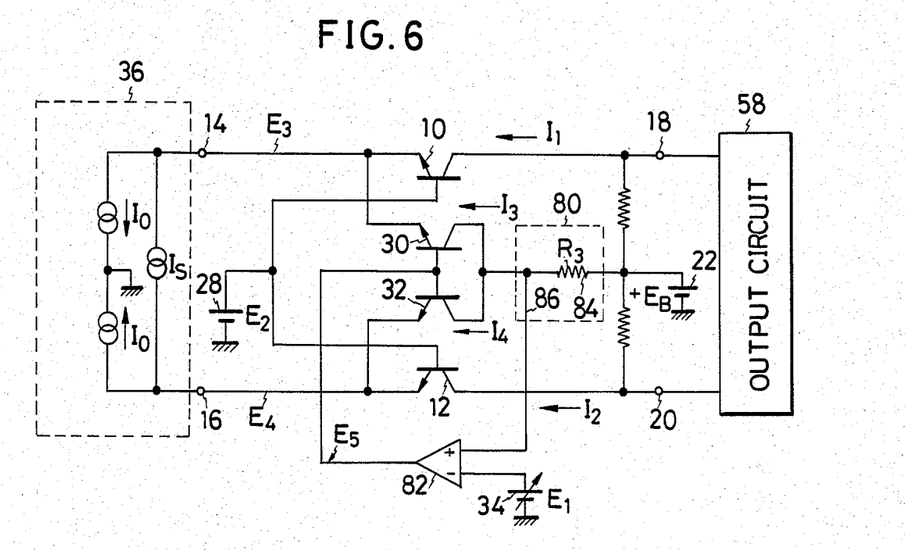
FIG. 6 is a schematic electrical diagram of a preferred form of the variable gain amplifier in accordance with my invention, which may be thought of as an improvement of the known FIG. 1 amplifier.

I will now proceed to the description of some preferable embodiments of my invention which are free from all the above discussed limitations of the prior art. FIG. 6 shows one such embodiment which differs from the known FIG. 1 amplifier in additionally comprising a collector current sensing circuit 80 and a differential amplifier 82 for feedback control. The other parts of this variable gain amplifier in accordance with my invention are of the same configuration as those of the prior art device of FIG. 1, so that I will refer to such parts with the same numerals as used to denote the corresponding parts of the FIG. 1 device. The input circuit 36 and output circuit 58 of the FIG. 6 amplifier can also be of the same configurations as in FIGS. 2 and 3 respectively.

The collector current sensing circuit 80 comprises a resistor 84 connected between the $+E_B$ power power supply 22 and the collectors of the second pair of transistors 30 and 32, and a line 86 connecting the collectors of these transistors 30 and 32 to the noninverting input of the differential amplifier 82. The inverting input of this differential amplifier is grounded via the variable voltage source 34 which is to be activated for gain control. The output of the differential amplifier 82 is connected to the bases of the second pair of transistors 30 and 32. Thus the differential amplifier 82 controls the second pair of transistors 30 and 32 with a voltage corresponding to the difference between its two input voltages. The feedback control is such that the voltage corresponding to the sum of the collector currents I3 and I4 of the transistors 30 and 32 becomes equal to the gain control voltage E1 of the variable voltage source 34.

Assuming that the four transistors 10, 12, 30 and 32 of the FIG. 6 amplifier have the same $V_{BE}$-$I_C$ characteristic, the collector currents I1, I2, I3 and I4 of these transistors can be expressed, from Equation (1), as $$I1 \approx K1 \exp [K3(E2-E3)] \quad (2)$$

$$I2 \approx K1 \exp [K3(E2-E4)] \quad (3)$$

$$I3 \approx K1 \exp [K3(E5-E3)] \quad (4)$$

$$I4 \approx K1 \exp [K3(E5-E4)] \quad (5)$$

where
E2 = the voltage of the fixed base bias source 28;
E3 = the emitter voltage of the first transistor 10;
E4 = the emitter voltage of the second transistor 12;
E5 = the output voltage of the differential amplifier 82;
K3 = K2/T in Equation (1).

The relations between the collector currents I1-I4 and the bias Io and signal current Is are given by $$I1 + I3 = Io + Is \quad (6)$$

$$I2 + I4 = Io - Is. \quad (7)$$

From Equations (2) through (5), $$I1 = I3 \cdot \exp [K3(2-E5)] \equiv M \cdot I3 \quad (8)$$

$$I2 = I4 \cdot \exp [K3(E2-E5)] \equiv M \cdot I4 \quad (9)$$

where M is exp K3(E2-E5).
Thus, from Equations (6) through (9), $$(M+1) \cdot I3 = Io + Is \quad (10)$$

$$(M+1) \cdot I4 = Io - Is \quad (11)$$

$$I3 + I4 = 2 Io/(M+1) \quad (12)$$

Io being greater than Is in Equation (11).

It will be seen from Equation (12) that the sum of the collector current I3 of the third transistor 30 and the collector current I4 of the fourth transistor 32 contains no signal component.

The FIG. 6 amplifier is equipped for feedback control such that the voltages on the inverting and noninverting inputs of the differential amplifier 14 become equal to each other. Accordingly the differential signal component (I1−I2) between the pair of output terminals 18 and 20 of this amplifier is given by $$\begin{aligned} I1 - I2 &= M(I3 - I4) \\ &= 2Is \, M/(1 + M) \\ &= 2Is[1 - (I3 + I4)/(2Io)]. \end{aligned} \quad (13)$$

Since the collector voltages of the transistors 30 and 32 are equal to the gain control voltage E1 as a result of the above feedback control, the current flowing through the resistor 84 of the collector current sensing circuit 80 is $(E_B-E1)/R3$, where R3 is the resistance of the resistor 84. Equation (13) can therefore be rewritten as $$\begin{aligned} I1 - I2 &= 2Is[1 - (E_B - E1)/2IoR3] \\ &= \frac{1}{IoR3} [E1 - (E_B - 2IoR3)] \cdot Is. \end{aligned} \quad (14)$$

The allowable range of the gain control voltage E1 for the proper operation of the FIG. 6 amplifier must be:

$$E_B \geqq E1 \geqq (E_B - 2IoR3).$$

As is apparent from Equation (14), the current gain from input terminals 14 and 16 to output terminals 18 and 20 is variable in the range from zero to one by changing the gain control voltage E1. The members Io, R3 and $E_B$ of Equation (14) have fixed values. Consequently the difference (I1−I2) between the collector currents of the transistors 10 and 12, and the gain (I1−I2)/Is, can be changed linearly with the gain control voltage E1. It is also to be appreciated that the gain control in accordance with my invention is totally unaffected by changes in temperature because Equation (14) contains no temperature member.

I have so far discussed the operation of the FIG. 6 amplifier on the assumption that the four transistors 10, 12, 30 and 32 have exactly the same $V_{BE}$-$I_C$ characteristic. This is not an absolute requirement. What is required is that the first pair of transistors 10 and 12 have the same $V_{BE}$-$I_C$ characteristic, and the second pair of transistors 30 and 32 have the same $V_{BE}$-$I_C$ characteristic. The transistors 10 and 30, and the transistors 12 and 32, may be of unlike characteristics. Then the constant K1 will have different values in Equations (2) and (4) and in Equations (3) and (5). However, if M is constant in Equations (8) and (9), only the output voltage E5 of the differential amplifier 82 will differ from that in the case where the four transistors 10, 12, 30 and 32 are all of the same characteristic. No other difference will occur. Accordingly Equation (14) holds true even with the noted dissimilarities in the characteristics of the four transistors, so that the gain of the FIG. 6 amplifier will change linearly with the gain control voltage E1.

Desirably, therefore, the electrical properties of the four transistors 10, 12, 30 and 32 in use in the FIG. 6 circuit should all be approximately alike, or the first pair of transistors 10 and 12, and the second pair of transistors 30 and 32, should be of identical electrical properties.

SECOND FORM

Figure 7:
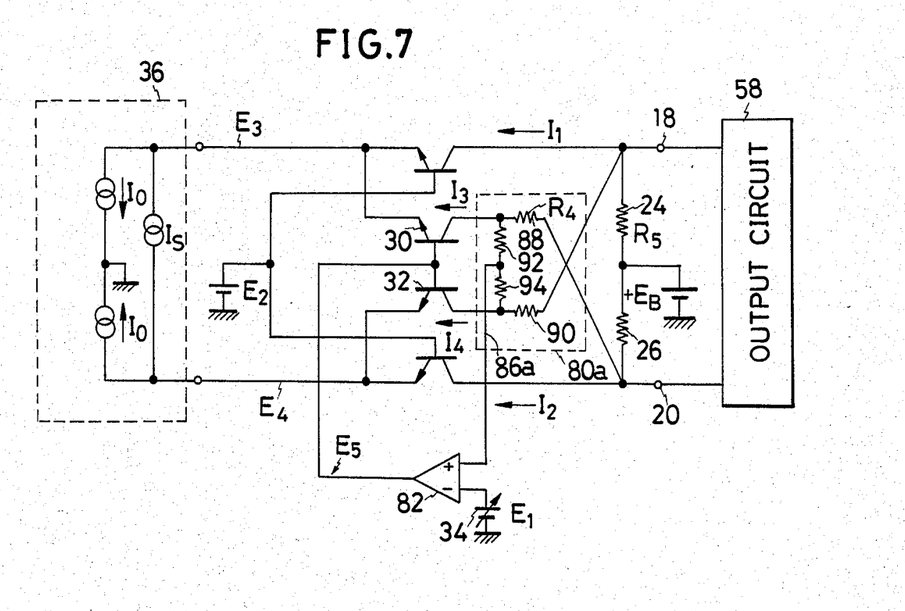
FIG. 7 is a schematic electrical diagram of another preferred form of the variable gain amplifier in accordance with my invention, which may be thought of as an improvement of the known FIG. 4 amplifier.

I have shown in FIG. 7 another preferable form of the variable gain amplifier in accordance with my invention. This amplifier is analogous in configuration with the known FIG. 4 amplifier except for the addition of a current sensing circuit 80a and the differential amplifier 82.

The current sensing circuit 80a comprises four resistors 88, 90, 92 and 94. The first resistor 88 is connected between the collector of the transistor 30 and the second output terminal 20. The second resistor 90 is connected between the collector of the transistor 32 and the first output terminal 18. The third 92 and fourth 94 resistors are connected in series between the collectors of the transistors 30 and 32. Also included in the current sensing circuit 80a is a line 86a connecting the point of junction between the resistors 92 and 94 to the noninverting input of the differential amplifier 82. The inverting input of this differential amplifier is grounded via the variable voltage source 34 for gain control. The other details of configuration are identical with those of the FIG. 4 amplifier. The input circuit 36 and output circuit 58 can also be configured as in FIGS. 2 and 3 respectively.

Let us assume that in the FIG. 7 amplifier, the resistance of the resistors 24 is equal to that of the resistor 26, the resistance of the resistor 88 equal to that of the resistor 90, the resistance of the resistor 92 equal to that of the resistor 94, and the resistance of the resistor 92 much greater than that of the resistor 88. Then the following equation is established:

$$(I1-I4)-(I2-I3)=(M-1)(I3-I4) \quad (15)$$

$$=2I_S(M-1)/(M+1)$$

$$=2I_S[1-(I3+I4)/I_0]$$

$$=\frac{4}{I_0 R4}\left[E1-\left(E_B-I_0 R5-\frac{I_0 R4}{2}\right)\right]$$

where R4 is the resistance of the resistor 88, and R5 is the resistance of the resistor 24.

The allowable range of the gain control voltage E1 for the proper operation of the FIG. 7 amplifier is $$E_B \geq E1 \geq (E_B - I_0 R5 - I_0 R4).$$

Equation (15) indicates that a linear change in the gain of the FIG. 7 amplifier is possible in the range from $-1$ to $+1$ by varying the gain control voltage E1. It will also be noted from Equation (15) that the gain is unaffected by temperatures. As regards possible variations in the $V_{BE}$-$I_C$ characteristic of the transistors in use, what I have stated in conection with FIG. 6 holds true with FIG. 7.

THIRD FORM

Figure 8:
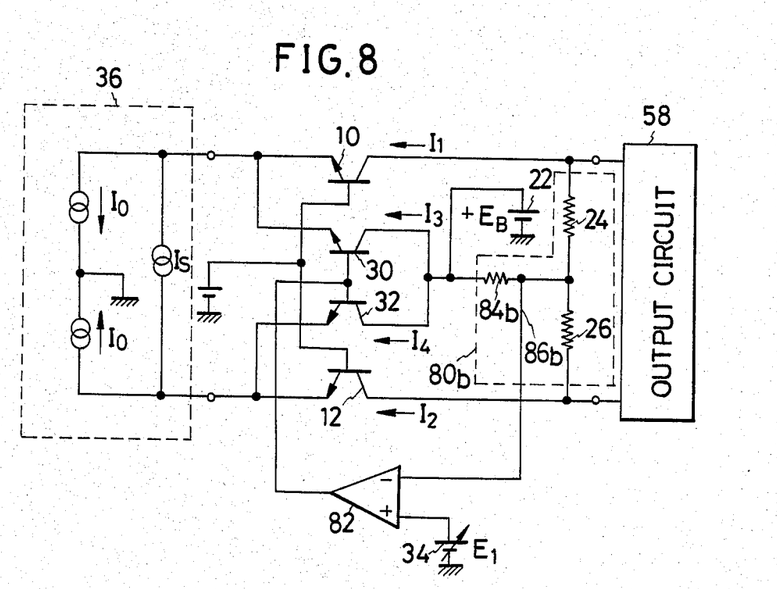
FIG. 8 is a schematic electrical diagram of a further preferred form of the variable gain amplifier in accordance with my invention, which is a modification of the FIG. 6 embodiment.

In FIG. 8 is shown a further preferred embodiment of my invention which in fact is a slight modification of the FIG. 6 amplifier. This modified amplifier includes a collector current sensing circuit 80b having a resistor 84b connected between the $+E_B$ power supply 22 and a point between the interconnected resistors 24 and 26 for the detection of the sum of the collector currents I1 and I2 of the pair of transistors 10 and 12. The resistor 84 is thus connected to the line through which flow the collector currents of the transistors 10 and 12. The collector current sensing circuit 80b has an output line 86b connected to the inverting input of the differential amplifier 82 for controlling the second pair of transistors 30 and 32 with a voltage corresponding to the detected sum of the collector currents I1 and I2. The noninverting input of the differential amplifier is grounded via the variable voltage source 34 for gain control. The other details of configuration of the FIG. 8 amplifier, including its input circuit 36 and output circuit 58, are identical with those of the FIG. 6 circuit. The advantages accruing from this amplifier are also as set forth above in connection with FIG. 6.

FOURTH FORM

Figure 9:
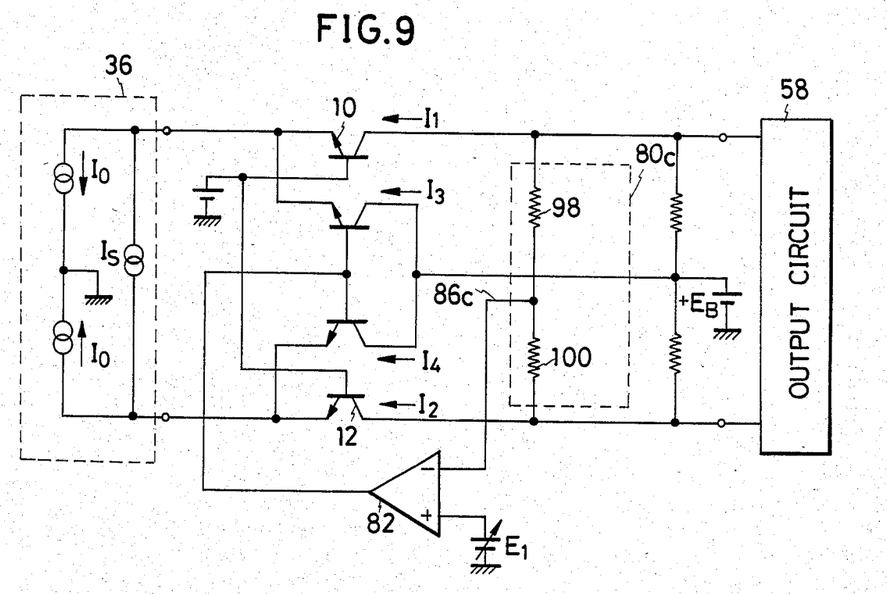
FIG. 9 is a schematic electrical diagram of a further preferred form of the variable gain amplifier in accordance with my invention, which also is a modification of the FIG. 6 embodiment.

FIG. 9 is an illustration of another slight modification of the FIG. 6 embodiment, featuring a modified collector current sensing circuit 80c adapted for detecting the sum of the collector currents I1 and I2 of the first pair of transistors 10 and 12. The sensing circuit 80c comprises two resistors 98 and 100 connected in series between the collectors of the transistors 10 and 12, and a line 86c connecting the midpoint between the resistors 98 and 100 to the inverting input of the differential amplifier 82. The other details of construction of this modified amplifier, including its input circuit 36 and output circuit 58, are identical with those of the FIG. 6 amplifier.

In operation the differential amplifier 82 controls the second pair of transistors 30 and 32 so that the voltage corresponding to the sum of the collector currents I1 and I2 may become equal to the gain control voltage E1. The advantages gained by this embodiment are as set forth above in connection with the FIG. 6 amplifier.

FIFTH FORM

Figure 10:
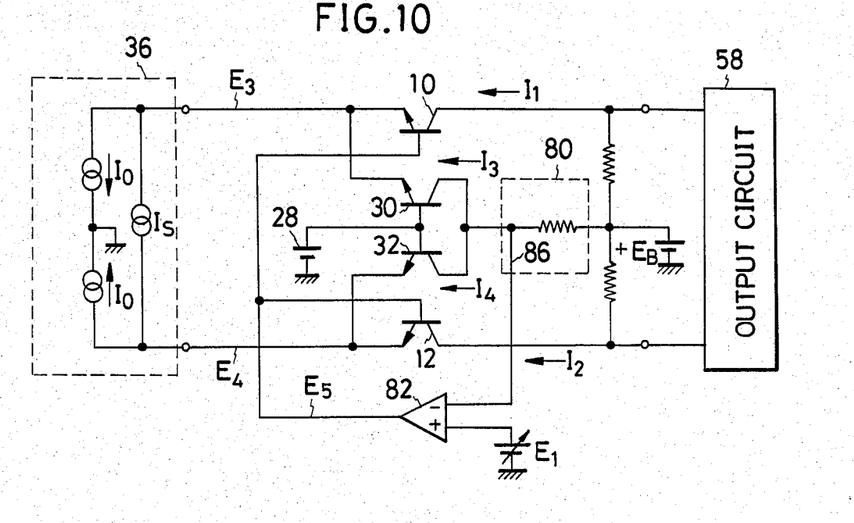
FIG. 10 is a schematic electrical diagram of a further preferred form of the variable gain amplifier in accordance with my invention, which also is a modification of the FIG. 6 embodiment.

In a further preferred embodiment shown in FIG. 10, which also is a slight modification of the FIG. 6 amplifier, the collector current sensing circuit 80 is constructed as in FIG. 6 but has its output line 86 connected to the inverting input of the differential amplifier 82. The output of this differential amplifier is connected to the bases of the first pair of transistors 10 and 12, instead of to those of the second pair of transistors 30 and 32 as in the FIG. 6 embodiment. The second pair of transistors 30 and 32 have their bases connected to the fixed bias source 28. The other details of construction of this amplifier, including its input circuit 36 and output circuit 58, are just like those of the FIG. 6 amplifier.

In operation the differential amplifier 82 controls the first pair of transistors 10 and 12 in accordance with the voltage corresponding to the sum of the collector currents I3 and I4 of the second pair of transistors 30 and 32. This embodiment gains the same advantages as those described in conjunction with the FIG. 6 embodiment.

SIXTH FORM

Figure 11:
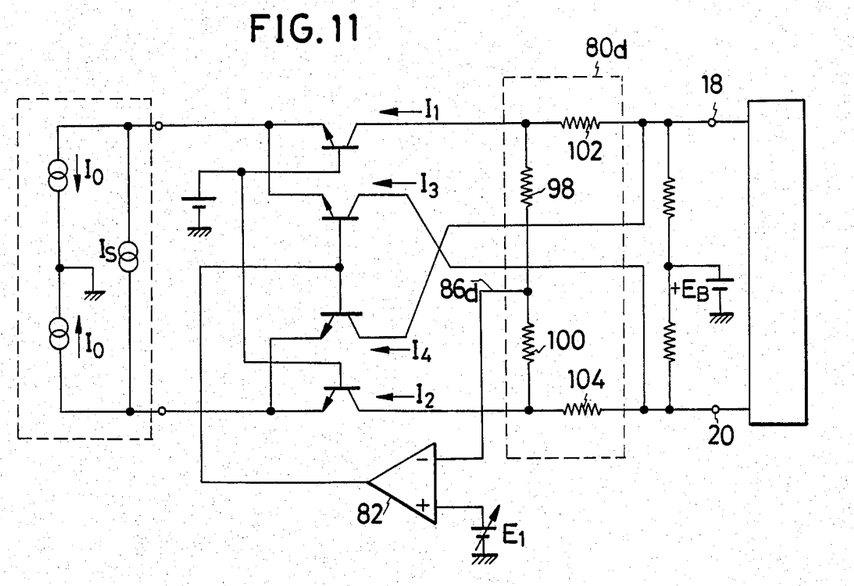
FIG. 11 is a schematic electrical diagram of a further preferred form of the variable gain amplifier in accordance with my invention, which is a modification of the FIG. 7 embodiment.

A further preferred embodiment shown in FIG. 11 is a slight modification of the FIG. 7 embodiment. Included is a collector current sensing circuit 80d adapted for the detection of the sum of the collector currents I1 and I2 of the first pair of transistors 10 and 12. The current sensing circuit 80d comprises the resistors 98 and 100 connected in series between the collectors of the first pair of transistors 10 and 12, another resistor 102 connected between the collector of the transistor 10 and the first output terminal 18, and still another resistor 104 connected between the collector of the transistor 12 and the second output terminal 20. A line 86d connects the junction point between the resistors 98 and 100 to the inverting input of the differential amplifier 82. The other details of construction of, and the advantages gained by, this amplifier are as set forth above with reference to FIG. 7.

SEVENTH FORM

Figure 12:
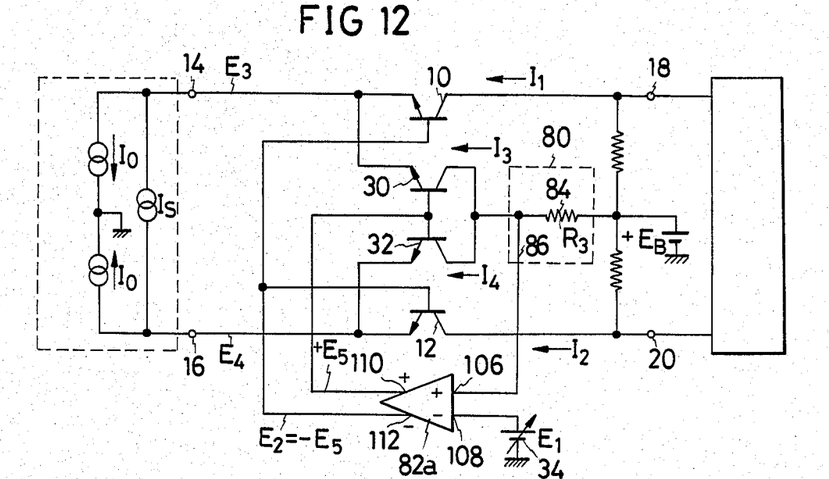
FIG. 12 is a schematic electrical diagram of a further preferred form of the variable gain amplifier in accordance with my invention, which is a modification of the FIG. 6 embodiment and which includes a two output differential amplifier in place of a single output differential amplifier used in all the previous embodiments.

FIG. 12 illustrates a further preferred embodiment which has the same collector current sensing circuit 80 as that of the FIG. 6 embodiment but in which the bases of the first pair of transistors 10 and 12 are not connected to the fixed bias source 28. The bases of the first pair of transistors 10 and 12 are connected, instead, to a two output differential amplifier 82a thereby to be impressed with a voltage of opposite phase to that of the voltage applied to the bases of the second pair of transistors 30 and 32. Given hereafter is a more detailed description of the two output differential amplifier 82a.

The differential amplifier 82a has noninverting and inverting inputs, herein designated 106 and 108 respectively, just like the differential amplifier 82 in all the preceding embodiments. The noninverting input 106 is connected to the line 86 leading to the collector current sensing circuit 80 whereas the inverting input 108 is grounded via the variable voltage source 34 for gain control, as in the FIG. 6 embodiment. The two outputs of the differential amplifier 82a are a first or noninverting output 110 and a second or inverting output 112. Connected to the bases of the second pair of transistors 30 and 32, the noninverting output 110 is intended for the delivery of a first differential output voltage corresponding to the difference between the two input voltages. The inverting output 112, on the other hand, is connected to the bases of the first pair of transistors 10 and 12 for the delivery of a second differential output voltage of the opposite phase to that of the first differential output voltage.

Figure 13:
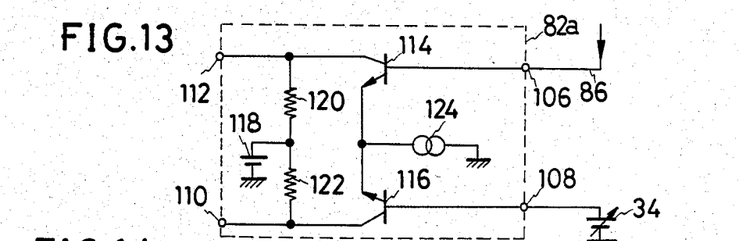
FIG. 13 is a schematic electrical diagram of the two output differential amplifier of the FIG. 12 embodiment.

FIG. 13 is a detailed representation of the two output differential amplifier 82a. Included are a pair of transistors 114 and 116 having their bases connected to the inputs 106 and 108 respectively. The collector of the transistor 114 is connected, on one hand, to the inverting output 112 and, on the other hand, to a collector bias voltage source 118 via a load resistor 120. The collector of the other transistor 116 is connected, on one hand, to the noninverting output 110 and, on the other hand, to the bias voltage source 118 via a load resistor 122. The emitters of both transistors 114 and 116 are both grounded via a common emitter bias current source 124.

The two output differential amplifier 82a configured as in the foregoing admits of two different modes of operation depending upon the relative resistances of the two load resistors 120 and 122. For one such mode of operation the resistances of the load resistors 120 and 122 may be set equal to each other, with the result that the differential amplifier 82a provides two differential output voltages of the same absolute value but of opposite phases. Alternatively the resistances of the load resistors 120 and 122 may be made different, so that there are produced two differential output voltages of different absolute values and opposite phases.

With reference back to FIG. 12 the two output differential amplifier 82a controls the two pairs of transistors 10, 12, 30 and 32 so that the voltage corresponding to the sum of the collector currents I3 and I4 of the second pair of transistors 30 and 32 may become equal to the gain control voltage E1. A more detailed discussion of operation follows.

If the four transistors 10, 12, 30 and 32 of the FIG. 12 amplifier have all the same $V_{BE}$-$I_C$ characteristic, their collector currents I1, I2, I3 and I4 can be expressed as follows from Equation (1):

$$I1 \approx K1 \exp[K3(E2-E3)] \quad (16)$$

$$I2 \approx K1 \exp[K3(E2-E4)] \quad (17)$$

$$I3 \approx K1 \exp[K3(E5-E3)] \quad (18)$$

$$I4 \approx K1 \exp[K3(E5-E4)] \quad (19)$$

where E2 is the base voltage of the first pair of transistors 10 and 12, and E5 is the base voltage of the second pair of transistors 30 and 32.

The relations between the collector currents I1, I2, I3 and I4 and the bias current Io and signal current Is can be expressed as $$I1 + I3 = Io + Is \quad (20)$$

$$I2 + I4 = Io - Is \quad (21)$$

From Equations (16) through (19)

$$I1 = I3 \exp[K3(E2-E5)] = M \cdot I3 \quad (22)$$

$$I2 = I4 \exp[K3(E2-E5)] = M \cdot I4 \quad (23)$$

where M is $\exp[K3(E2-E5)]$.

From Equations (20) through (23)

$$(M+1)I3 = Io + Is \quad (24)$$

$$(M+1)I4 = Io - Is \quad (25)$$

$$I3 + I4 = 2Io/(M+1) \quad (26)$$

Io is assumed to be greater than Is in Equation (25). As is evident from Equation (26), the sum of the collector currents I3 and I4 of the second pair of transistors 30 and 32 contains no signal component.

The differential signal component (I1−I2) between the output terminals 18 and 20 of the FIG. 12 amplifier, during its feedback control such that the input voltages of the differential amplifier 82a are made equal to each other, can be defined as $$\begin{aligned} I1 - I2 &= M(I3 - I4) \\ &= 2IsM/(1+M) \\ &= 2Is[1 - (I3 + I4)/(2Io)]. \end{aligned} \quad (27)$$

Since the collector voltage of the second pair of transistors 30 and 32 is equal to the gain control voltage E1 while the FIG. 12 amplifier is being feedback controlled as above, the current flowing through the resistor 84 of the collector current sensing circuit 80 is $(E_B - E1)/R3$. Equation (27) may therefore be rewritten as $$\begin{aligned} I1 - I2 &= 2I_s \left[ 1 - \frac{E_B - E1}{2I_o R3} \right] \\ &= \frac{1}{I_o R3}[E1 - (E_B - 2I_o R3)] \cdot I_s \end{aligned} \quad (28)$$

The gain control voltage E1 must be set in the range not less than $(E_B - 2IoR3)$ and not more than $E_B$ for the proper performance of the amplifier. Equation (28) proves that the current gain of the FIG. 12 amplifier, from its input terminals 14 and 16 to output terminals 18 and 20, is also variable from zero to one by changes in the gain control voltage E1. The members Io, R3 and $E_B$ of Equation (28) have fixed values, so that a linear relation is established between the gain control voltage $E_1$ and the collector current differential $(I_1-I_2)$ or gain $(I_1-I_2)/I_S$. The gain of the FIG. 12 amplifier is also totally unaffected by temperatures.

As has also been stated in connection with the FIG. 6 embodiment, the four transistors 10, 12, 30 and 32 of the FIG. 12 embodiment need not be of the same $V_{BE}$-$I_C$ characteristic. All that is required, again, is that the first pair of transistors 10 and 12 have the same $V_{BE}$-$I_C$ characteristic, and the second pair of transistors 30 and 32 have the same $V_{BE}$-$I_C$ characteristic. If the characteristic in question differs between the transistors 10 and 30, and between the transistors 12 and 32, then the constant K1 will have different values in Equations (16) and (18) and in Equations (17) and (19). However, provided that M is constant in Equations (22) and (23), only the output voltages E5 of the differential amplifier 82a will have a different absolute value from that in the case where the four transistors 10, 12, 30 and 32 are all of the same characteristic. Thus Equation (28) holds true, assuring a linear relation between the gain control voltage E1 and the gain of the FIG. 12 amplifier.

EIGHT FORM

Figure 14:
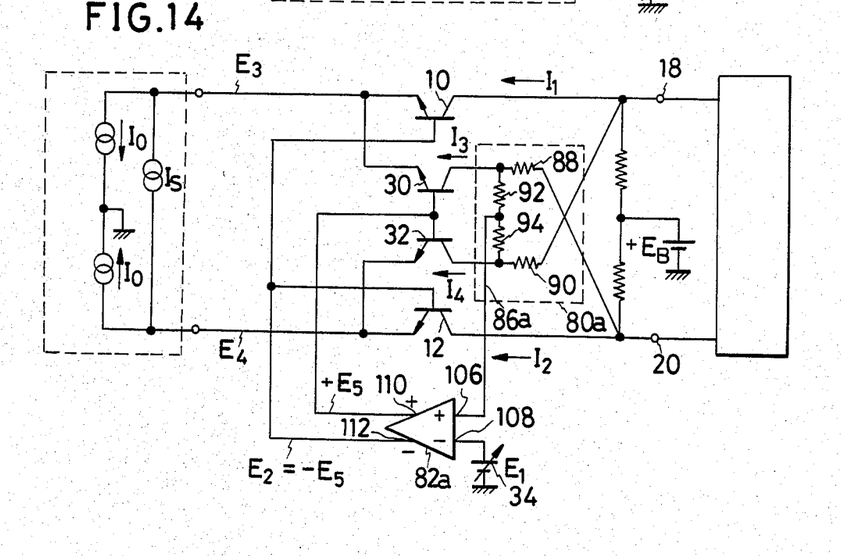
FIG. 14 is a schematic electrical diagram of a further preferred form of the variable gain amplifier in accordance with my invention, which is a modification of the FIG. 7 embodiment in accordance with the teachings of FIGS. 12 and 13.

In FIG. 14 the FIG. 7 amplifier is shown modified in accordance with the teachings of FIG. 12. Thus it comprises the collector current sensing circuit 80a having the resistors 88 and 90 connected between the collectors of the transistors 30 and 32 and the output terminals 18 and 20, the resistors 92 and 94 connected in series between the collectors of the transistors 30 and 32, and the line 86a connecting the midpoint between the resistors 92 and 94 to the noninverting input 106 of the two output differential amplifier 82a. Constructed as shown in detail in FIG. 13, the differential amplifier 82a has its inverting input connected to the variable voltage source 34, its noninverting output 110 connected to the bases of the second pair of transistors 30 and 32, and its inverting output 112 connected to the bases of the first pair of transistors 10 and 12. The other details of construction are as set forth above with reference to FIG. 7.

Thus, in the FIG. 14 amplifier, the bias voltage applied to the first pair of transistors 10 and 12 is opposite in phase to that applied to the second pair of transistors 30 and 32. It is self evident from the foregoing description of FIGS. 7 and 12 that the FIG. 14 amplifier can also attain the objectives of my invention.

NINTH FORM

Figure 15:
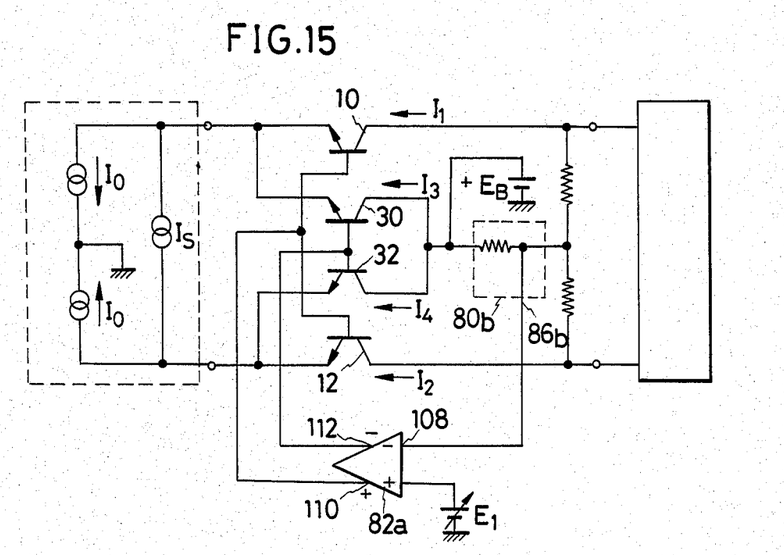
FIG. 15 is a schematic electrical diagram of a further preferred form of the variable gain amplifier in accordance with my invention, which is a slight modification of the FIGS. 12 and 13 embodiment.

FIG. 15 shows a modification of the FIG. 8 amplifier in accordance with the teachings of FIG. 12. Thus the modified amplifier includes the collector current sensing circuit 80b having the line 86b connected to the inverting input 108 of the two output differential amplifier 82a. Further, instead of being connected to the fixed bias source as in FIG. 8, the bases of the first pair of transistors 10 and 12 are connected to the noninverting output 110 of the differential amplifier 82a. The bases of the second pair of transistors 30 and 32 are connected to the inverting output 112 of the differential amplifier 82a. The bias voltages applied to the two pairs of transistors are therefore opposite in phase. The other details of construction and operation are as set forth above with reference to FIGS. 8 and 12.

TENTH FORM

Figure 16:
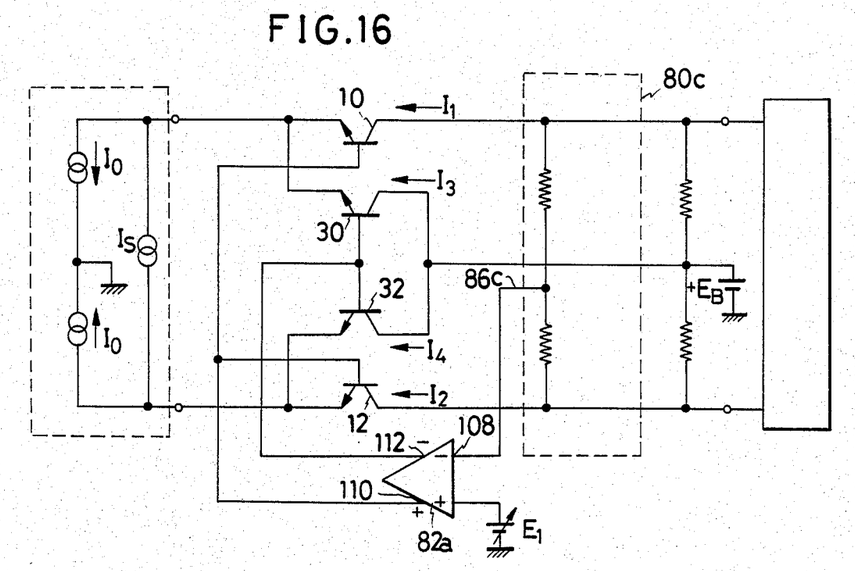
FIG. 16 is a schematic electrical diagram of a further preferred form of the variable gain amplifier in accordance with my invention, which also is a slight modification of the FIGS. 12 and 13 embodiment.

Shown in FIG. 16 is a modification of the FIG. 9 amplifier in accordance with the teachings of FIG. 12. The modified amplifier includes the collector current sensing circuit 80c having the line 86c connected to the inverting input 108 of the two output differential amplifier 82a. The bases of the first pair of transistors 10 and 12 are connected to the noninverting output 110 of the differential amplifier 82a, instead of being connected to the fixed bias source as in FIG. 9. The bases of the second pair of transistors 30 and 32 are connected to the inverting output 112 of the differential amplifier 82a. The bias voltages applied to the two pairs of transistors are therefore opposite in phase. The other details of construction and operation are as set forth above with reference to FIGS. 9 and 12.

POSSIBLE MODIFICATIONS

Although I have shown and described my invention in terms of what I believe to be preferable embodiments thereof, it is understood that these are by way of example only and not to impose limitations upon my invention. A variety of modifications or variations of the above disclosed embodiments will readily occur to the electronics specialists without departing from the scope of my invention as expressed in the appended claims. The following is a brief list of such possible modifications:

1. Transistors or equivalent devices may be substituted for the illustrated load resistors 24 and 26 for the first pair of transistors 10 and 12.

2. The collectors of the second pair of transistors 30 and 32 may not necessarily be biased by the common power supply 22 but by separate means.

3. The collectors of the two pairs of transistors 10, 12, 30 and 32 may not necessarily be biased by the common power supply 22, but a separate collector bias source may be provided for each pair of transistors.

4. The FIGS. 7 and 11 embodiments may also be modified to control the first pair of transistors 10 and 12 by the output from the differential amplifier 82.

5. The collector current sensing circuit 80, 80a, etc., may be comprised of magnetoelectric conversion or other means instead of a resistor or resistors as in the illustrated embodiments.

6. The input circuit 36, shown in detail in FIG. 2, may be also modified in a variety of ways; for instance, a single ended voltage signal input means may be connected to the bases of the transistors 44 and 46.

7. Grounded base transistors may be connected each between transistor 10 and first output terminal 18 and between transistor 12 and second output terminal 20.

I claim:

1. A variable gain amplifier system comprising:
   (a) input means having first and second input terminals for receiving differential inputs;
   (b) output means having first and second output terminals for providing differential outputs in response to the differential inputs;
   (c) a first transistor having an emitter connected to the first input terminal and a collector connected to the first output terminal;
   (d) a second transistor having an emitter connected to the second input terminal, a collector connected to the second output terminal, and a base connected to a base of the first transistor;

(e) the first and second transistors making up a first pair of transistors;

(f) a third transistor having an emitter connected to the first input terminal;

(g) a fourth transistor having an emitter connected to the second input terminal and a base connected to a base of the third transistor;

(h) the third and fourth transistors making up a second pair of transistors;

(i) collector bias means for biasing the collectors of the second pair of transistors;

(j) collector current sensing means for providing a voltage representative of the sum of the collector currents of either of the first and second pairs of transistors;

(k) a variable voltage source for providing a variable gain control voltage for controllably varying the current gain between the first input terminal and the first output terminal and between the second input terminal and the second output terminal;

(l) a differential amplifier for applying to the bases of either of the first and second pairs of transistors a voltage proportional to the difference between the output voltage of the collector current sensing means and the gain control voltage from the variable voltage source; and (m) base bias means connected to the bases of the other of the first and second pairs of transistors.

2. The variable gain amplifier system as recited in claim 1, wherein the collectors of the second pair of transistors are interconnected, and wherein the collector bias means comprises a collector bias power supply connected between the interconnected collectors of the second pair of transistors and ground.

3. The variable gain amplifier system as recited in claim 2, wherein the collector current sensing means comprises:

(a) a resistor connected between the interconnected collectors of the second pair of transistors and the collector bias power supply; and (b) a line connecting the interconnected collectors of the second pair of transistors to an input of the differential amplifier.

4. The variable gain amplifier system as recited in claim 2, wherein the collector current sensing means comprises:

(a) first and second resistors connected in series between the first and second output terminals;

(b) a third resistor connected between a midpoint between the first and second resistors and the collector bias power supply; and (c) a line connecting the midpoint between the first and second resistors to an input of the differential amplifier.

5. The variable gain amplifier system as recited in claim 2, wherein the collector current sensing means comprises:

(a) first and second resistors connected in series between the collectors of the first pair of transistors; and (b) a line connecting a midpoint between the first and second resistors to an input of the differential amplifier.

6. The variable gain amplifier system as recited in claim 2, further comprising:

(a) a first resistor connected between the collector bias power supply and the collector of the first transistor; and (b) a second resistor connected between the collector bias power supply and the collector of the second transistor.

7. The variable gain amplifier system as recited in claim 1, wherein the collector of the third transistor is connected to the second output terminal, wherein the collector of the fourth transistor is connected to the first output terminal, and wherein the collector bias means is adapted to apply a bias voltage to the first and second output terminals.

8. The variable gain amplifier system as recited in claim 7, wherein the collector current sensing means comprises:

(a) a first resistor connected between the collector oof the third transistor and the second output terminal;

(b) a second resistor connected between the collector of the fourth transistor and the first output terminal;

(c) third and fourth transistors connected in series between the collectors of the third and fourth transistors; and (d) a line connecting a midpoint between the third and fourth resistors to an input of the differential amplifier.

9. The variable gain amplifier system as recited in claim 7, wherein the collector current sensing means comprises:

(a) a first resistor connected between the collector of the first transistor and the first output terminal;

(b) a second resistor connected between the collector of the second transistor and the second output terminal;

(c) third and fourth resistors connected in series between the collectors of the first and second transistors; and (d) a line connecting a midpoint between the third and fourth transistors to an input of the differential amplifier.

10. The variable gain amplifier system as recited in claim 1, wherein the base bias means comprises a power supply adapted to apply a DC bias voltge to the bases of said other of the first and second pairs of transistors.

11. The variable gain amplifier system as recited in claim 1, wherein the base bias means is adapted to apply to said other of the first and second pairs of transistors a voltage opposite in phase to the voltage applied by the differential amplifier to said either of the first and second pairs of transistors.

12. The variable gain amplifier system as recited in claim 1, wherein the input means further comprises:

(a) a third pair of transistors having collectors connected to the first and second input terminals respectively;

(b) a differential voltage signal input circuit connected between the bases of the third pair of transistors;

(c) a resistor connected between the emitters of the third pair of transistors.

13. A variable gain amplifier system comprising:

(a) input means having first and second input terminals for receiving differential inputs respectively;

(b) output means having first and second output terminals for producing differential outputs in response to the received differential inputs;

(c) a first transistor having an emitter connected to the first input terminal and a collector connected to the first output terminal;

(d) a second transistor having an emitter connected to the second input terminal, a collector connected to the second output terminal, and a base connected to a base of the first transistor;
(e) the first and second transistors making up a first pair of transistors;
(f) a third transistor having an emitter connected to the first input terminal and a collector connected to the second output terminal;
(g) a fourth transistor having an emitter connected to the second input terminal, a collector connected to the first output terminal, and a base connected to a base of the third transistor;
(h) the third and fourth transistors making up a second pair of transistors;
(i) collector bias means connected to the first and second output terminals for biasing the collectors of the first and second pairs of transistors;
(j) collector current sensing means for providing a voltage representative of the sum of the collector currents of either of the first and second pairs of transistors;
(k) a variable voltage source for providing a variable gain control voltage for controllably varying the current gain between the first input terminal and the first output terminal and between the second input terminal and the second output terminal;
(l) a differential amplifier for applying to the bases of either of the first and second pairs of transistors a voltage proportional to the difference between the output voltage of the collector current sensing means and the gain control voltage from the variable voltage source; and
(m) a fixed base bias source connected to the bases of the other of the first and second pairs of transistors.

14. A variable gain amplifier system comprising:
(a) input means having first and second input terminals for receiving differential inputs;
(b) output means having first and second output terminals for producing differential outputs in response to the differential inputs received;
(c) a first transistor having an emitter connected to the first input terminal and a collector connected to the first output terminal;
(d) a second transistor having an emitter connected to the second input terminal, a collector connected to the second output terminal, and a base collected to a base of the first transistor;
(e) the first and second transistors making up a first pair of transistors;
(f) a third transistor having an emitter connected to the first input terminal;
(g) a fourth transistor having an emitter connected to the second input terminal and a base connected to a base of the third transistor;
(h) the third and fourth transistors making up a second pair of transistors;
(i) collector bias means for biasing the collectors of the second pair of transistors;
(j) collector current sensing means for providing a voltage proportional to the sum of the collector currents of either of the first and second pairs of transistors;
(k) a variable voltage source for providing a variable gain control voltage for controllably varying the current gain between the first input terminal and the first output terminal and between the second input terminal and the second output terminal; and
(l) a two output differential amplifier for producing first and second differential output voltages in phase opposition to each other, the first output voltage being proportional to the difference between the output voltage of the collector current sensing means and the gain control voltage from the variable voltage source, the differential amplifier delivering the first output voltage to the bases of the second pair of transistors and delivering the second output voltage to the base of the first pair of transistors.

15. The variable gain amplifier system as recited in claim 14, wherein the differential amplifier is so adapted that the first and second differential output voltages thereof have the same absolute value.

16. The variable gain amplifier system as recited in claim 14, wherein the differential amplifier is so adapted that the first and second differential output voltages thereof have different absolute values.

17. A variable gain amplifier system comprising:
(a) input means having first and second input terminals for receiving differential inputs;
(b) output means having first and second output terminals for producing differential outputs in response to the differential inputs received;
(c) a first transistor having an emitter connected to the first input terminal and a collector connected to the first output terminal;
(d) a second transistor having an emitter connected to the second input terminal, a collector connected to the second output terminal, and a base connected to a base of the first transistor;
(e) the first and second transistors making up a first pair of transistors;
(f) a third transistor having an emitter connected to the first input terminal and a collector connected to the second output terminal;
(g) a fourth transistor having an emitter connected to the second input terminal, a collector connected to the first input terminal, and a base connected to a base of the third transistor;
(h) the third and fourth transistors making up a second pair of transistors;
(i) collector bias means connected to the first and second output terminals for biasing the collectors of the first and second pairs of transistors;
(j) collector current sensing means for providing a voltage proportional to the sum of the collector currents of the second pair of transistors;
(k) a variable voltage source for providing a variable gain control voltage for controllably varying the current gain between the first input terminal and the first output terminal and between the second input terminal and the second output terminal; and
(l) a two output differential amplifier for producing first and second differential output voltages in phase opposition to each other, the first output voltage being proportional to the difference between the output voltage of the collector current sensing means and the gain control voltage from the variable voltage source, the differential amplifier delivering the first output voltage to the bases of the second pair of transistors and delivering the second output voltage to the bases of the first pair of transistors.

18. The variable gain amplifier system as recited in claim 17, wherein the differential amplifier is so adapted that the first and second output voltages thereof have the same absolute value.

19. The variable gain amplifier system as recited in claim 17, wherein the differential amplifier is so adapted that the first and second output voltages thereof have different absolute values.

* * * * *

UNITED STATES PATENT AND TRADEMARK OFFICE
CERTIFICATE OF CORRECTION

PATENT NO. : 4,523,153
DATED : June 11, 1985
INVENTOR(S) : YASUHIRA ITOH

It is certified that error appears in the above-identified patent and that said Letters Patent is hereby corrected as shown below:

Column 2, line 43, change "of" (2nd occurrence) to --to--.

Column 4, line 24, change "band" to --hand--.

Column 4, line 67, change "(I1-I2)Is" to --(I1-I2)/Is--.

Column 4, line 68, change "or" to --to--.

Column 5, line 5, change "be" to --by--.

Column 5, line 46, change "The" to --This--.

Column 5, line 68, delete the comma following "FIG. 4".

Column 6, line 51, change "disadvantages" to --disadvantage--.

Column 16, line 15 change "oof" to --of--.

Signed and Sealed this

Twenty-second Day of October 1985

[SEAL]

Attest:

DONALD J. QUIGG

Attesting Officer

Commissioner of Patents and
Trademarks—Designate